(12) United States Patent
Chou et al.

(10) Patent No.: US 10,090,593 B2
(45) Date of Patent: Oct. 2, 2018

(54) RADIO FREQUENCY DEVICE WITH MECHANISMS FOR THE ADJUSTMENT OF THE IMPEDANCES AND FREQUENCIES OF ITS ANTENNAS

(71) Applicant: Unictron Technologies Corp., Hsin-Chu (TW)

(72) Inventors: Chih-Shen Chou, Hsin-Chu (TW); Tsung-Shou Yeh, Hsin-Chu (TW); Hsiang-Cheng Yang, Hsin-Chu (TW); Chih-Chi Yen, Hsin-Chu (TW); Yih-Wei Yang, Hsin-Chu (TW)

(73) Assignee: Unictron Technologies Corporation, Hsin-Chu (TW)

( * ) Notice: Subject to any disclaimer, the term of this patent is extended or adjusted under 35 U.S.C. 154(b) by 203 days.

(21) Appl. No.: 15/271,146

(22) Filed: Sep. 20, 2016

(65) Prior Publication Data

US 2017/0093043 A1 Mar. 30, 2017

(30) Foreign Application Priority Data

Sep. 24, 2015 (TW) .............................. 104215470 U

(51) Int. Cl.

| | |
|---|---|
| *H03C 1/52* | (2006.01) |
| *H01Q 9/04* | (2006.01) |
| *H05K 1/18* | (2006.01) |
| *H03H 7/38* | (2006.01) |
| *H05K 1/14* | (2006.01) |
| *H01Q 1/38* | (2006.01) |
| *H01Q 1/48* | (2006.01) |

(Continued)

(52) U.S. Cl.
CPC .......... *H01Q 9/0442* (2013.01); *H01Q 1/243* (2013.01); *H01Q 1/38* (2013.01); *H01Q 1/48* (2013.01); *H01Q 5/335* (2015.01); *H01Q 9/0421* (2013.01); *H03H 7/38* (2013.01); *H05K 1/144* (2013.01); *H05K 1/181* (2013.01); *H05K 2201/041* (2013.01); *H05K 2201/10098* (2013.01)

(58) Field of Classification Search
CPC ...... H01Q 9/0421; H01Q 9/0442; H03H 7/38; H05K 1/144; H05K 1/181; H05K 2201/041; H05K 2201/10098
USPC ................ 455/107, 347, 349; 343/850, 860; 361/748–753, 760–761, 764
See application file for complete search history.

(56) References Cited

U.S. PATENT DOCUMENTS

| | | | |
|---|---|---|---|
| 2009/0011726 A1* | 1/2009 | Nishimura ............. | H04B 1/082 455/120 |
| 2014/0062794 A1* | 3/2014 | Guo ..................... | H01Q 9/0414 343/700 MS |

* cited by examiner

*Primary Examiner* — Lee Nguyen
(74) *Attorney, Agent, or Firm* — Winston Hsu

(57) ABSTRACT

A radio frequency device with mechanisms for adjustment of the impedances and frequencies of its antennas comprises a first circuit board, a radio frequency module and a second circuit board. The radio frequency module is disposed on the first circuit board that is disposed on the second circuit board. The radio frequency module comprises an antenna unit, a first frequency tuning element and a radio frequency circuitry. The antenna unit is disposed within a clearance area of the first circuit board, and connected to the radio frequency circuitry via a feeding circuit. The second circuit board comprises a second frequency tuning element that is electrically connected to the antenna unit via a ground circuit and the first frequency tuning element on the first circuit board. Thus, the resonance frequency of the antenna unit can be adjusted according to the first and the second frequency tuning element.

25 Claims, 19 Drawing Sheets

(51) Int. Cl.
*H01Q 1/24* (2006.01)
*H01Q 5/335* (2015.01)
*H04B 1/02* (2006.01)

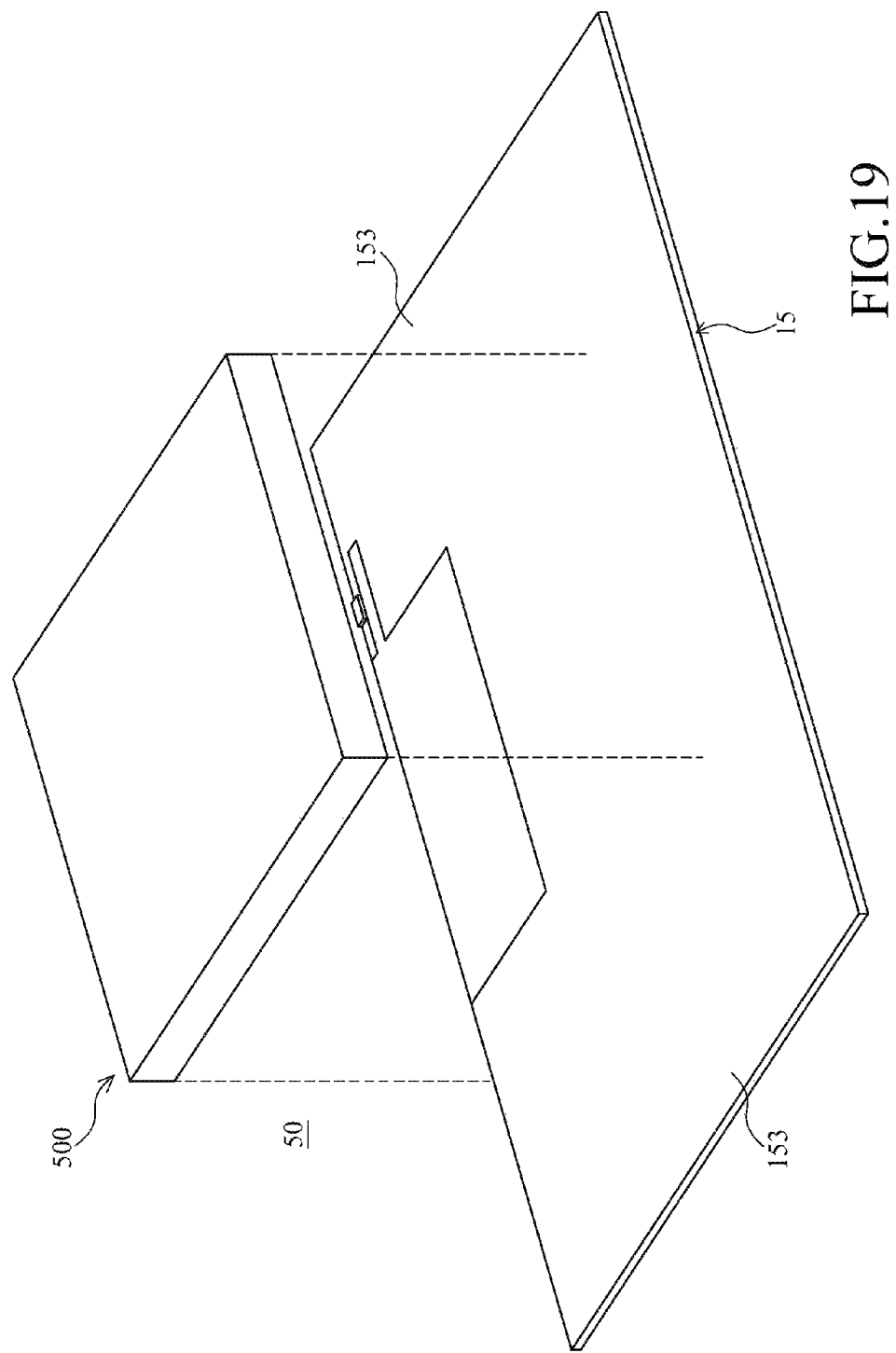

RADIO FREQUENCY DEVICE WITH MECHANISMS FOR THE ADJUSTMENT OF THE IMPEDANCES AND FREQUENCIES OF ITS ANTENNAS

REFERENCE TO RELATED APPLICATIONS

This non-provisional application claims priority claim under 35 U.S.C. § 119(a) on Taiwan Patent Application No. 104215470 filed Sep. 24, 2015, the entire contents of which are incorporated herein by reference.

FIELD OF THE INVENTION

The invention relates to a radio frequency device with mechanisms for the adjustment of the impedances and the frequencies of its antennas. The impedances and the frequencies of the antennas can be adjusted by displacing a first frequency tuning element of a first circuit board and/ or a second frequency tuning element of a second circuit board.

BACKGROUND

With fast progress of wireless communication technology, wireless communication products have been widely used in our daily life. The radio frequency device is one of most important devices for wireless communication products.

Development time of the wireless communication product can be saved by modular design of the radio frequency device. Original Design Manufacturers can purchase appropriate radio frequency module according to requirement to achieve characteristics of the new wireless communication product. However, the functionalities of the wireless communication product are becoming more and more diversified, and the sizes of the wireless communication product are becoming smaller and smaller. Thus, when the radio frequency module with an antenna is disposed on the circuit board or within the wireless communication product, the resonance frequency and the impedance of the antenna may be shifted and cause poor communication quality.

For avoiding the above problems, the manufacturer of the radio frequency module must adjust the resonance frequency and the impedance of each antenna respectively according to the structural or electrical variations of each wireless communication products. Thus, when the radio frequency module is disposed within the wireless communication product, good performance of the radio frequency module can be still achieved. However, since each radio frequency module needs to be fine-tuned to meet the requirements of specific wireless product, the manufacturing cost and the lead time of the radio frequency module and the wireless communication product will be increased.

SUMMARY

It is, therefore, the main objective of the present invention to provide a radio frequency device with mechanisms for the adjustment of the impedances and frequencies of its antennas. The radio frequency device comprises a first circuit board, a radio frequency module and a second circuit board. The radio frequency module is disposed on the first circuit board, and the first circuit board is disposed on the second circuit board. An antenna unit of the radio frequency module is connected with a second frequency tuning element on the second circuit board via a ground line and a first frequency tuning element. Thus, the resonance frequency and the impedance of the antenna unit can be adjusted by displacing the first frequency tuning element and/or the second frequency tuning element.

It is another objective of the present invention to provide a radio frequency device with mechanisms for the adjustment of the impedances and frequencies of its antennas. The resonance frequency of the antenna unit can be adjusted by displacing the first frequency tuning element on the first circuit board and the second frequency tuning element on the second circuit board. Since for most practical applications, the radio frequency module and the first circuit board are commercial products and the circuit cannot be easily changed. Therefore, it is very useful to implement the present invention, then it is unnecessary to alter the circuit of the radio frequency module after disposing the radio frequency module and the first circuit board on the second circuit board. The resonance frequency shift of the antenna unit can be easily corrected by displacing the second frequency tuning element which is located on the second circuit board. Therefore, the resonance frequency of the chip antenna can be easily fine-tuned by users.

It is another objective of the present invention to provide a radio frequency device with mechanisms for the adjustment of the impedances and frequencies of its antennas. The first impedance matching element of the first circuit board and the second impedance matching element of the second circuit board can be used to adjust impedance of the antenna unit. In this way it is unnecessary to alter circuit of the radio frequency module after disposing the radio frequency module and the first circuit board on the second circuit board. The impedance shift of the antenna unit can be modified by displacing the second impedance matching element located on the second circuit board.

For achieving above objects, the present invention provides a radio frequency device with mechanisms for the adjustment of impedances and frequencies of its antennas comprising: a first circuit board; at least one radio frequency module disposed on the first circuit board, and comprising an antenna unit, a first frequency tuning element, a first impedance matching element, a first clearance area, a plurality of ground lines, a radio frequency circuitry, a feed line and a first ground layer, wherein the first clearance area is located on the first circuit board; the antenna unit is located within the first clearance area of the first circuit board and is electrically connected to at least one of the ground lines, the feed line and the first frequency tuning element; the first frequency tuning element is electrically connected to the antenna unit and at least one of the ground lines; and the first impedance matching element is electrically connected to the feed line and then is electrically connected to the radio frequency circuitry and the antenna unit via the feed line; and a second circuit board disposed under the first circuit board, and comprising a second ground layer, a second frequency tuning element, wherein the second ground layer is electrically connected to the first ground layer; and one end of the second frequency tuning element is electrically connected to the second ground layer, and the other end of the second frequency tuning element is electrically connected to the first frequency tuning element via at least one of the ground lines on the first circuit board.

The present invention provides another radio frequency device with mechanisms for the adjustment of the impedances and frequencies of its antennas comprising: a first circuit board; at least one radio frequency module disposed on the first circuit board, and comprising an antenna unit, a first frequency tuning element, a second frequency tuning element, a first impedance matching element, a second impedance matching element, a first clearance area, a plurality of ground lines, a radio frequency circuitry, a first feed line, a second feed line and a first ground layer, wherein the first clearance area is located on the first circuit board; the antenna unit having two resonance frequencies is located within the first clearance area of the first circuit board, and is electrically connected to the ground lines, the first feed line, the second feed line, the first frequency tuning element and the second frequency tuning element; the first frequency tuning element is electrically connected to the antenna unit, the first feed line and at least one of the ground lines; the second frequency tuning element is electrically connected to the antenna unit, the second feed line and at least one of the ground lines; the first impedance matching element is electrically connected to the first feed line, and then is electrically connected to the radio frequency circuitry and the antenna unit via the first feed line; and the second impedance matching element is electrically connected to the second feed line, and then is electrically connected to the radio frequency circuitry and the antenna unit via the second feed line; and a second circuit board disposed under the first circuit board, and comprising a second ground layer, a third frequency tuning element and a fourth frequency tuning element, wherein the second ground layer is electrically connected to the first ground layer; the third frequency tuning element is electrically connected to the first frequency tuning element on the first circuit board; and the fourth frequency tuning element is electrically connected to the second frequency tuning element on the first circuit board.

BRIEF DESCRIPTION OF THE DRAWINGS

The structure as well as preferred modes of use, further objects, and advantages of this invention will be best understood by referring to the following detailed description of some illustrative embodiments in conjunction with the accompanying drawings, in which:

FIG. 19 is a partially exploded perspective view of a radio frequency device with mechanisms for the adjustment of the impedances and frequencies of its antennas according to another embodiment of the invention.

DETAILED DESCRIPTION OF THE PREFERRED EMBODIMENTS

Figure 1:
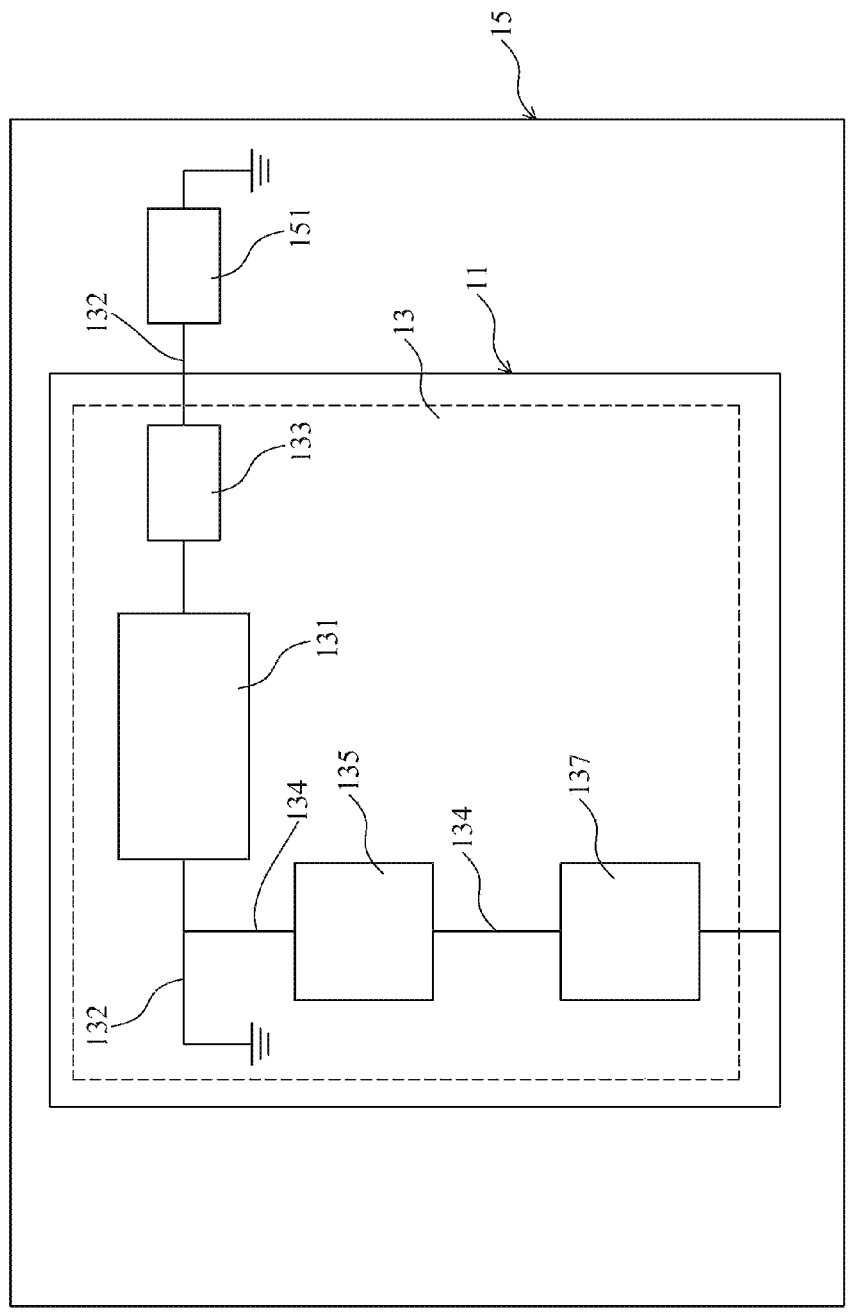
FIG. 1 is a block diagram of a radio frequency device with mechanisms for the adjustment of the impedances and frequencies of its antennas according to an embodiment of the invention.
Figure 2:
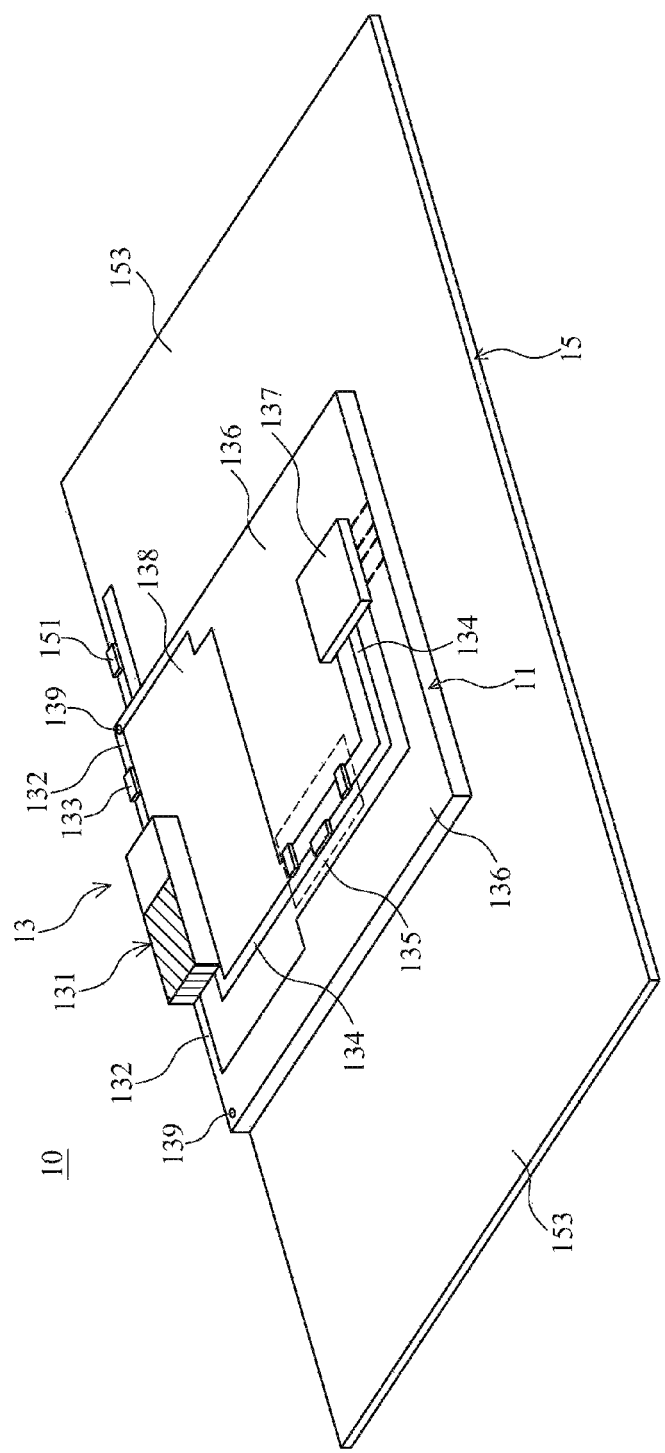
FIG. 2 is a perspective view of a radio frequency device with mechanisms for the adjustment of the impedances and frequencies of its antennas according to an embodiment of the invention.
Figure 3:
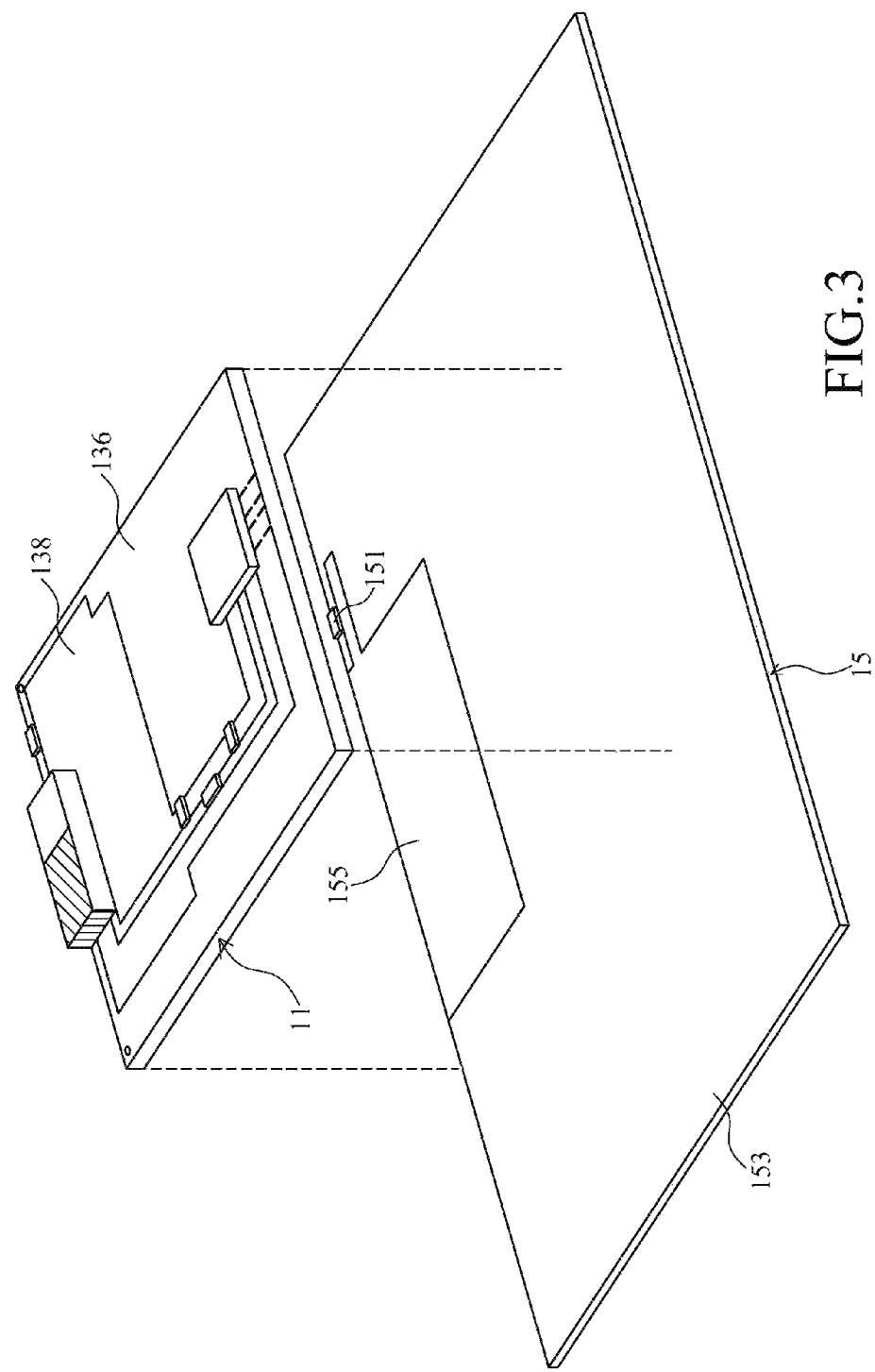
FIG. 3 is a partially exploded perspective view of a radio frequency device with mechanisms for the adjustment of the impedances and frequencies of its antennas according to an embodiment of the invention.

FIG. 1 to FIG. 3 are respectively a block diagram, a perspective view and a partially exploded perspective view of a radio frequency device with mechanisms for the adjustment of the impedances and frequencies of its antennas according to an embodiment of the invention. The radio frequency device 10 comprises a first circuit board 11, a radio frequency module 13 and a second circuit board 15. The radio frequency module 13 is disposed on the first circuit board 11, and the second circuit board 15 is disposed under the first circuit board 11.

In one embodiment of the invention, elements or circuit disposed on the first circuit board 11 may be defined as the radio frequency module 13. For example, the radio frequency module 13 may comprise an antenna unit 131, a plurality of ground lines 132, a first frequency tuning element 133, a feed line 134, a first impedance matching element 135, a first ground layer 136, a radio frequency circuitry 137 and a first clearance area 138. The radio frequency circuitry 137 may include at least one integrated circuit (IC) or at least one semiconductor chip which is needed for the processing of radio frequency signals. The first clearance area 138 is located on the first circuit board 11, and the antenna unit 131 is located within the first clearance area 138 of the first circuit board 11.

The antenna unit 131 is electrically connected to at least one ground line 132, the feed line 134 and the first frequency tuning element 133.

The first impedance matching element 135 and the radio frequency circuitry 137 are both electrically connected to the feed line 134, and the radio frequency circuitry 137 is electrically connected to the antenna unit 131 via the feed line 134 and the first impedance matching element 135.

The second circuit board 15 comprises a second frequency tuning element 151 and a second ground layer 153. The second ground layer 153 is electrically connected to the first ground layer 136 on the first circuit board 11. The second frequency tuning element 151 is electrically connected to the second ground layer 153, and the second frequency tuning element 151 is further electrically connected to the first frequency tuning element 133 via at least one ground line 132 on the first circuit board 11. For example, the second ground layer 153 is electrically connected to the antenna unit 131 via the second frequency tuning element 151, the ground line 132 and the first frequency tuning element 133.

The first frequency tuning element 133 and the second frequency tuning element 151 are used to adjust or modify the resonance frequency of the antenna unit 131. The first frequency tuning element 133 and the second frequency tuning element 151 may comprise at least one passive component, such as at least one capacitor or at least one inductor or at least one resistor.

In actual application, when the first circuit board 11 and the radio frequency module 13 are disposed on the second circuit board 15, the resonance frequency of the antenna unit 131 on the radio frequency module 13 may be shifted due to electrical circuits or components existed on the second circuit board 15. For example, after electrically connecting the first circuit board 11 and the radio frequency module 13 to the circuits or the elements on the second circuit board 15, the resonance frequency of the antenna unit 131 may be changed.

Thus, after disposing the first circuit board 11 and the radio frequency module 13 on the second circuit board 15, the resonance frequency of the antenna unit 131 may deviate from the originally designated frequency, and the antenna unit 131 may not work normally. In the commercial applications, the radio frequency module and the first circuit board may be off the shelf standard products which are not able to be revised or modified easily. In this case, the second frequency tuning element 151 may be used for adjusting resonance frequency of the antenna unit 131 of the radio frequency module 13. For example, the second frequency tuning element 151 may be a capacitor with proper capacitance, an inductor with proper inductance or a zero-ohm resistor to adjust the resonance frequency of the antenna unit 131 of the radio frequency module 13. Thus, when the first circuit board 11 and the radio frequency module 13 are disposed on the second circuit board 15, the resonance frequency of the antenna unit 131 is able to meet the requirements.

The first circuit board 11 is overlaid on top of the second circuit board 15, wherein a connecting unit 139 may be disposed on the first circuit board 11 to build up the electrical connectivity between the first ground layer 136 and the second ground layer 153. For example, the connecting unit 139 can electrically connect the conductive circuits of the first circuit board 11 to the corresponding conductive circuits of the second circuit board 15. In particular embodiment, the connecting unit 139 may pass through the first circuit board 11 or be disposed along the side of the first circuit board 11 to electrically connect the first ground layer 136 to the second ground layer 153 or connect the conductive circuits on the first circuit board 11 to corresponding conductive circuit on the second circuit board 15. The setting modes of connecting unit 139 are embodiments of the invention, and are not limitation of the invention. In other embodiment, the radio frequency circuitry 137 on the first circuit board 11 may be electrically connected to the second circuit board 15 according to the requirement of the radio frequency device.

In one embodiment of the invention, the second circuit board 15 further comprises a second clearance area 155, wherein the second clearance area 155 is located on the vertically extending region of the first clearance area 138, as shown in FIG. 3. When the first circuit board 11 is disposed on the second circuit board 15, the first clearance area 138 of the first circuit board 11 will approximately overlap the second clearance area 155 of the second circuit board 15. Therefore, the antenna unit 131 is also located above the second clearance area 155 and the performance of the antenna unit 131 will not be impaired by the second ground layer 153.

In one embodiment of the invention, the antenna unit 131 comprises a substrate 1311 and a plurality of conducting layers 1313/1315, wherein each conducting layer 1313/1315 may be located on the surface of the substrate 1311 or within the substrate 1311, and the antenna unit 131 is disposed in the first clearance area 138 of the first circuit board 11. Further, at least one ground line 132 is respectively connected to the conducting layers 1313 and 1315 of the antenna unit 131, and feed line 134 is connected to at least one conducting layer 1315 of the antenna unit 131. A capacitive effect (for example, a region performing like a capacitor) can be developed between conducting layer 1313 and 1315, as a result the resonance frequency of the antenna unit 131 is established. For example, the conducting layer may comprise a first conducting layer 1313 and a second conducting layer 1315, wherein the first conducting layer 1313 is disposed on the top or bottom surface of the substrate 1311 or within the substrate 1311 and is electrically connected to the ground line 132 via the first frequency tuning element 133. The second conducting layer 1315 is disposed on the bottom or top surface of the substrate 1311 or within the substrate 1311 and is connected to the feed line 134 and at least one ground line 132, and then is electrically connected to the first impedance matching element 135 via the feed line 134. The capacitive effect or region performing like a capacitor is formed between the first conducting layer 1313 and the second conducting layer 1315 so as to establish the resonance frequency of the antenna unit 131.

Figure 4:
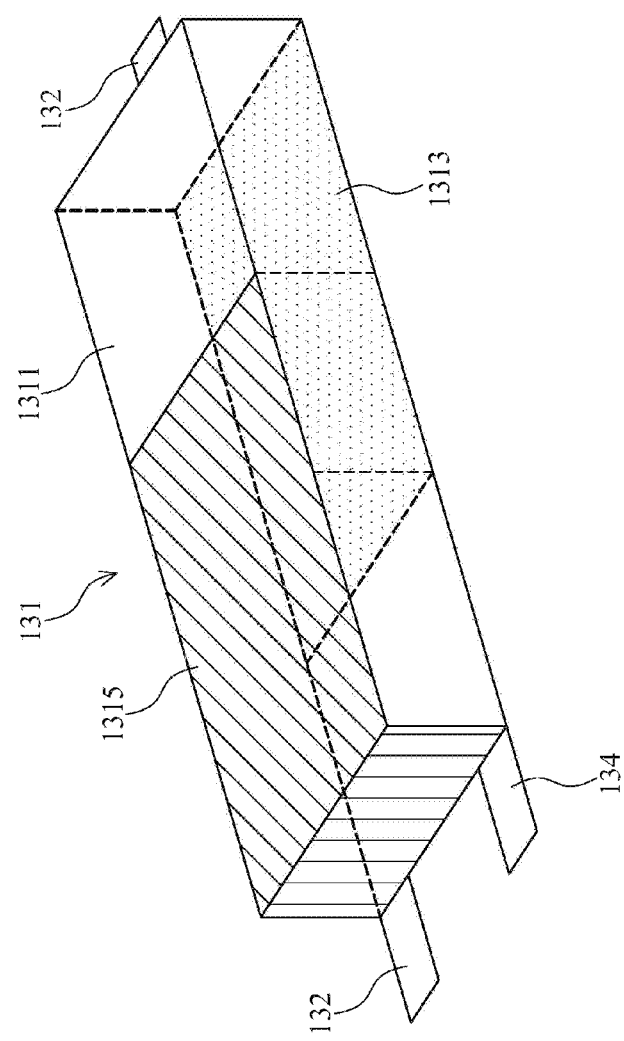
FIG. 4 is a perspective view of an antenna of a radio frequency device according to an embodiment of the invention.
Figure 5:
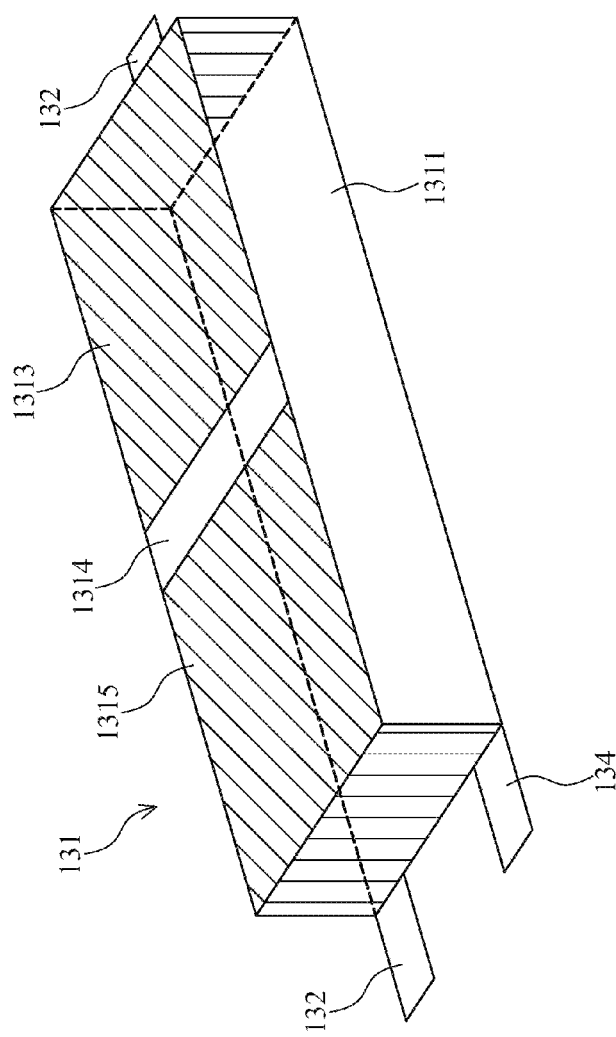
FIG. 5 is a perspective view of an antenna of a radio frequency device according to another embodiment of the invention.

In particular embodiment, the first conducting layer 1313 and the second conducting layer 1315 are respectively disposed on two opposite surfaces of the substrate 1311, wherein part of the first conducting layer 1313 overlaps part of the second conducting layer 1315 to form the capacitive effect or a region performing like a capacitor therebetween and establish the resonance frequency of the antenna unit 131, as shown in FIG. 4. In other embodiment of the invention, the first conducting layer 1313 and the second conducting layer 1315 are disposed on the same or substantially same plane of the substrate 1311, and a gap 1314 is located between the first and second conducting layers 1313/1315 to form the capacitive effect or a region performing like a capacitor and establish the resonance frequency of the antenna unit 131, as shown in FIG. 5. The antenna units 131 described by FIGS. 4 and 5 are embodiments of the invention, and are not limitation of the invention. Person having ordinary skill in the art may be able to replace the antenna unit with different form.

Figure 6:
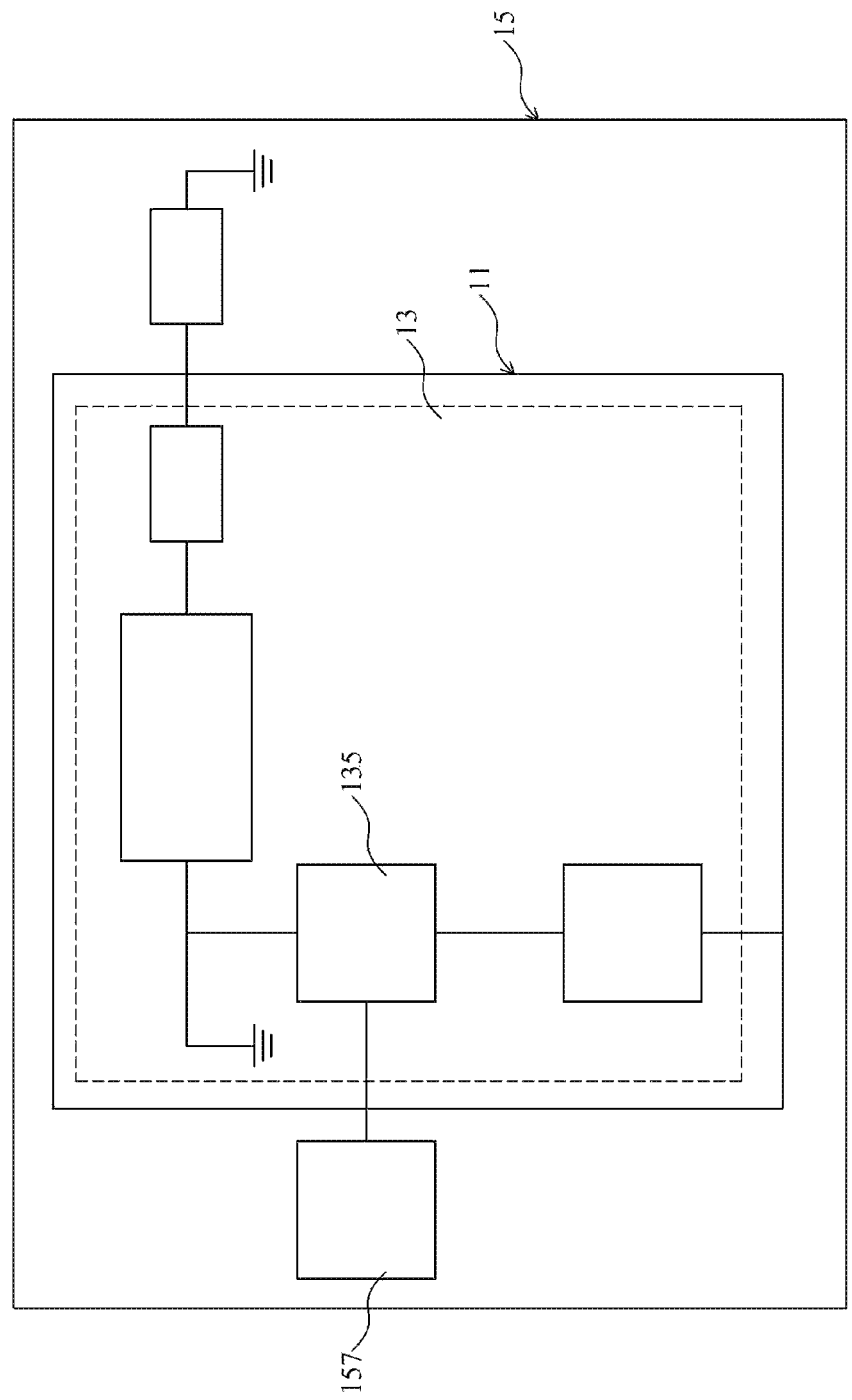
FIG. 6 is a block diagram of a radio frequency device with mechanisms for the adjustment of the impedances and frequencies of its antennas according to another embodiment of the invention.
Figure 7:
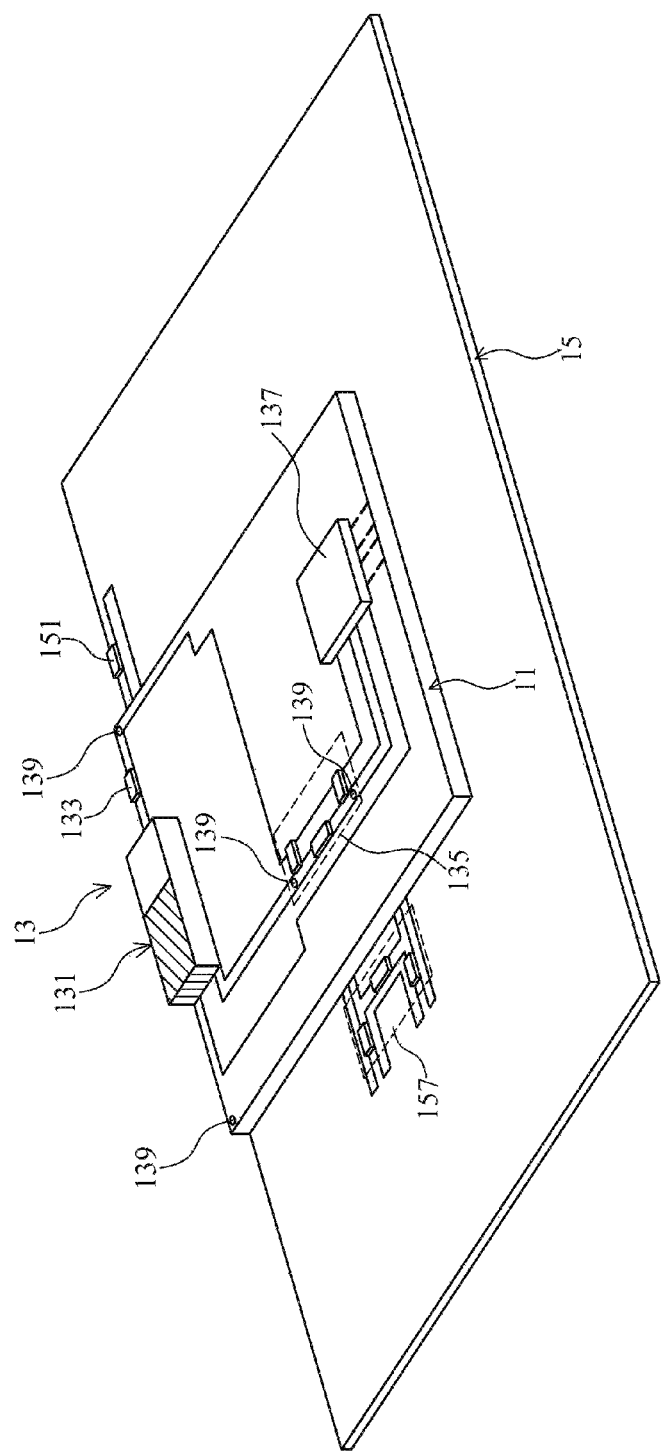
FIG. 7 is a perspective view of a radio frequency device with mechanisms for the adjustment of the impedances and frequencies of its antennas according to an embodiment of the invention.

In other embodiment of the invention, a second impedance matching circuit 157 may be disposed on the second circuit board 15, as shown in FIG. 6 and FIG. 7. The second impedance matching circuit 157 on the second circuit board 15 is electrically connected to first impedance matching circuit 135 on the first circuit board 11. When the radio frequency module 13 is disposed on the second circuit board 15, the impedance of the antenna unit 131 may be shifted due to the influences of the dimension or the components or metallization parts of the second circuit board. However, as mentioned previously, the radio frequency module 13 may not be able to be modified easily, thus, by fine tuning the second impedance matching circuit 157, the impedance of the antenna unit 131 can be easily adjusted.

In one embodiment of the invention, the first impedance matching element 135 and the second impedance matching element 157 may be a resistor, a capacitor, an inductor or a it matching circuit. Generally, when the first circuit board 11 and the radio frequency module 13 are disposed on the second circuit board 15, the impedance of the antenna unit 131 of the radio frequency module 13 may be influenced by the dimensions and/or other devices of the second circuit board 15 leading to impedance mismatch between the antenna unit 131 and the radio frequency circuitry 137. Thus, the second impedance matching element 157 on the second circuit board 15 can be used, such as proper selection of resistors, capacitors, and/or inductors as the second impedance matching element, to achieve optimized impedance matching of the radio frequency circuitry 137 and the antenna unit 131 of the radio frequency module 13.

As above embodiment of the invention, when the first circuit board 11 and the radio frequency module 13 are disposed on the second circuit board 15, the antenna 131 of the radio frequency module 13 may be influenced by dimensions and/or other devices of the second circuit board 15 leading to the resonance frequency shift of the antenna unit 131 of the radio frequency module 13, or impedance mismatch between the antenna unit 131 and the radio frequency circuitry 137. Conventionally, the first frequency tuning element 133 and the first impedance matching element 135 on the first circuit board 11 of the radio frequency module 13 may be adjusted or displaced according to the extent of influence caused by the second circuit board 15. For example, the resistor, the capacitor, or the inductor of the first frequency tuning element 133 and/or the first impedance matching element 135 on the radio frequency module 13 may be displaced. However, if the first circuit board 11 or the radio frequency module 13 has been certified by third party or has been encapsulated by electronic packaging measure, the elements of the first circuit board 11 or the radio frequency module 13 may not be allowed to be displaced. Thus, this invention is able to provide a solution to adjust the impedance matching or the resonant frequency of the antenna unit 131 and to significantly improve the performance of the radio frequency module 13.

As above description of the invention, the second frequency tuning element 151 and/or the second impedance matching element 157 can be disposed on the second circuit board 15 to be electrically connected with the first frequency tuning element 133 and/or the first impedance matching element 135 of the first circuit board 11 respectively. Further, the second frequency tuning element 151 and/or the second impedance matching element 157 may be displaced, after disposing the radio frequency module 13 and the first circuit board 11 on the second circuit board 15. Accordingly, the resonant frequency of the antenna unit 131 can meet the specifications, and the impedance matching between the antenna unit 131 and the radio frequency circuitry 137 can be achieved.

Figure 8:
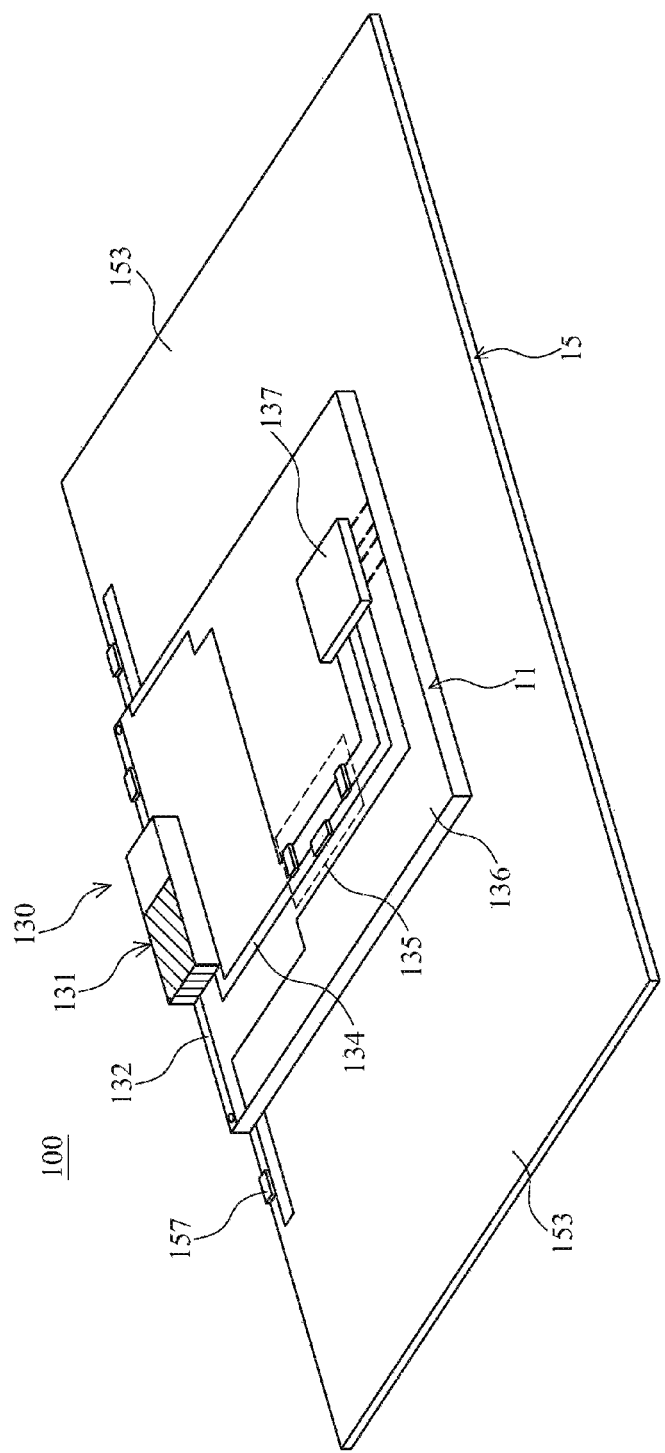
FIG. 8 is a perspective view of a radio frequency device with mechanisms for the adjustment of the impedances and frequencies of its antennas according to an embodiment of the invention.

FIG. 8 is a perspective view of a radio frequency device with mechanisms for adjustment of the impedances and frequencies of its antennas according to another embodiment of the invention. The radio frequency device 100 is similar to the radio frequency device 10 in the FIG. 2. One of the main differences between the radio frequency device 100 and 10 is that the ground line 132 which is connecting the first frequency tuning element 133 of the radio frequency device 100 does not be connected to the first ground layer 136 of the first circuit board 11. On the contrary, the ground line 132 which is connecting the first frequency tuning element 133 of the radio frequency device 10 is connected to the first ground layer 136 of the first circuit board 11 directly, as shown in FIG. 2. Furthermore, the ground line 132 which does not be connected to the first frequency tuning element 133 of the radio frequency device 100 is connected to the second ground layer 153 of the second circuit board 15 via a second impedance matching element 157. The above mentioned ground line 132 is also electrically connected to the feed line 134 and then is also connected to the first impedance matching element 135 and the radio frequency circuitry 137 through the feed line 134.

The second impedance matching element 157 on the second circuit board 15 is electrically connected to the first impedance matching element 135 on the first circuit board 11. Thus, the second impedance matching element 157 can be used to adjust the impedance of the antenna unit 131 to eliminate the impedance mismatch of the antenna unit 131 when the radio frequency module 130 is disposed on the second circuit board 15. In one embodiment of the invention, the second impedance matching element 157 may be a resistor, a capacitor, an inductor or a it matching circuit.

Figure 9:
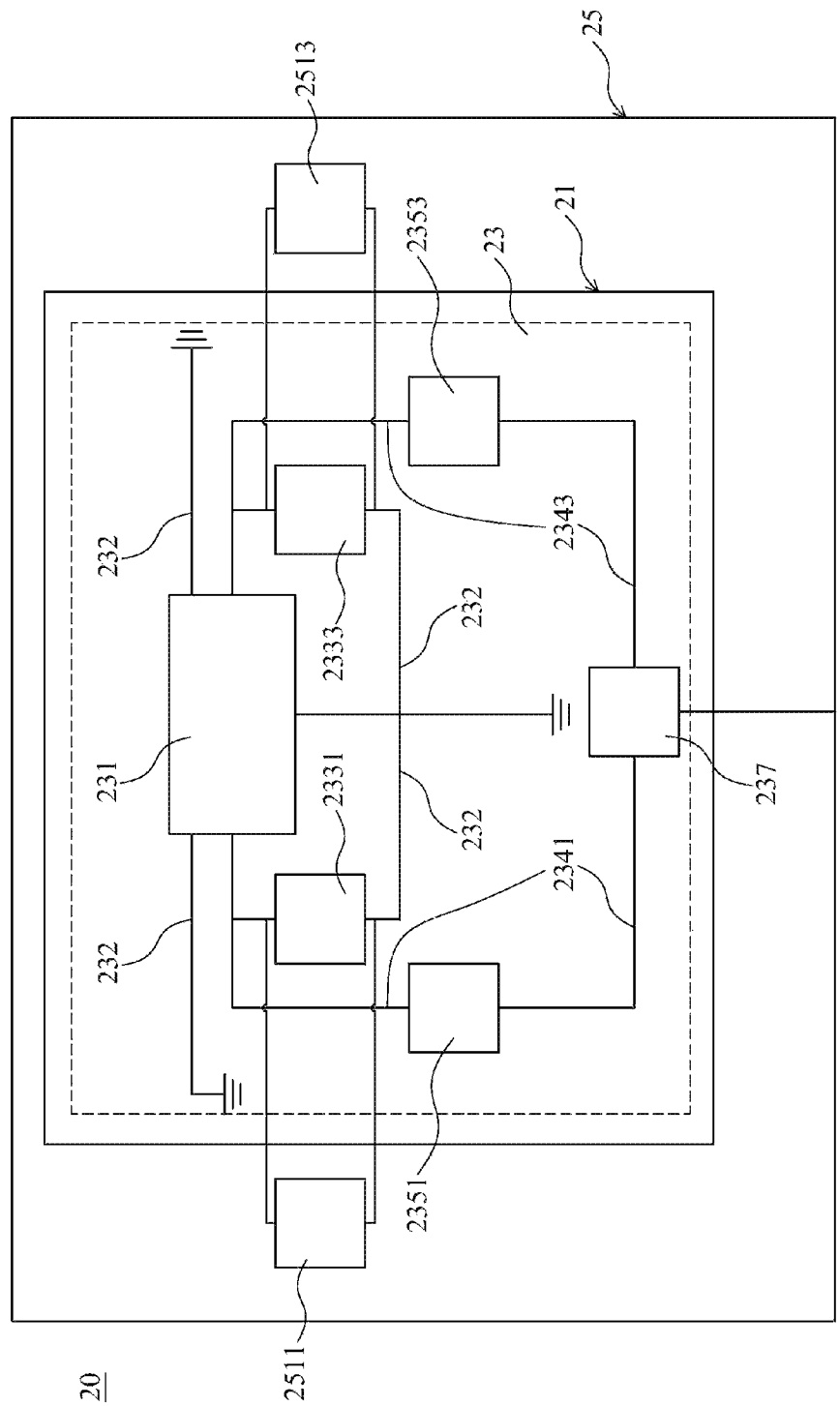
FIG. 9 is a block diagram of a radio frequency device with mechanisms for the adjustment of the impedances and frequencies of its antennas according to another embodiment of the invention.
Figure 10:
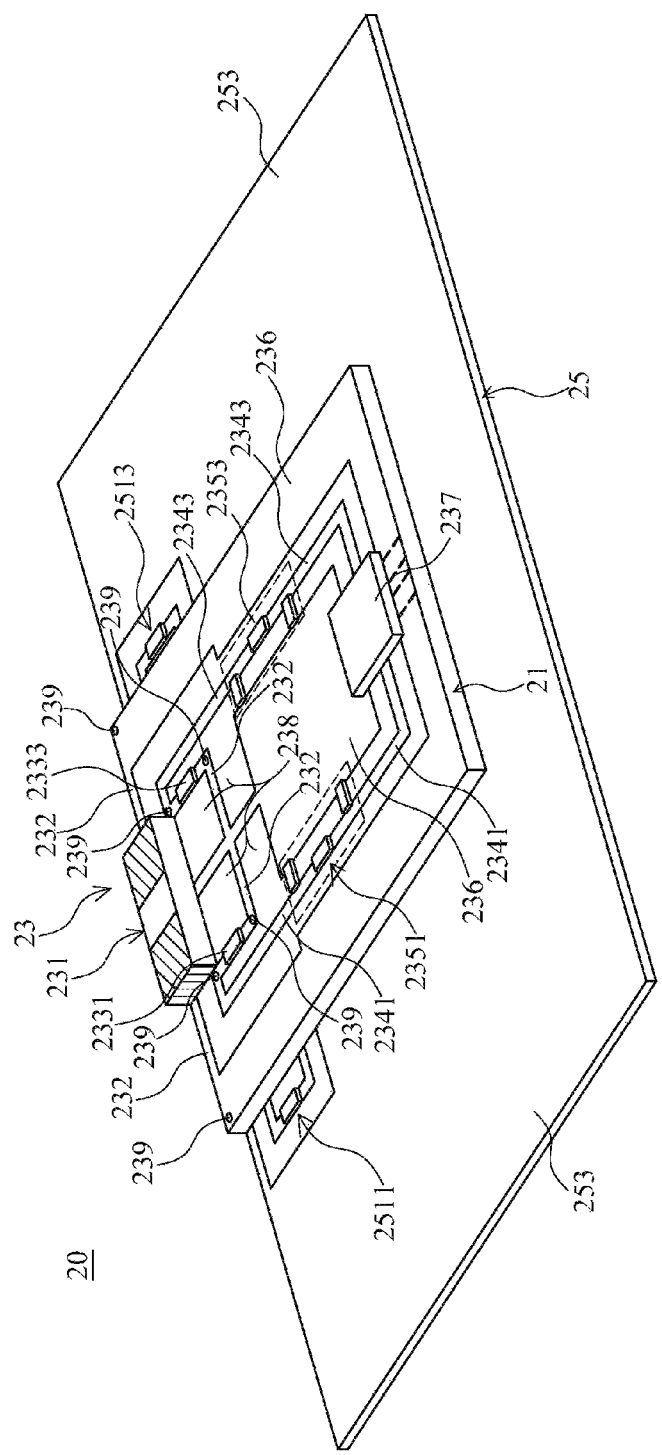
FIG. 10 is a perspective view of a radio frequency device with mechanisms for the adjustment of the impedances and frequencies of its antennas according to another embodiment of the invention.

FIG. 9 and FIG. 10 are respectively a block diagram and a perspective view of a radio frequency device with mechanisms for adjustment of the impedances and frequencies of its antennas according to another embodiment of the invention. The radio frequency device 20 comprises a first circuit board 21, a radio frequency module 23 and a second circuit board 25, wherein the radio frequency module 23 is disposed on the first circuit board 21, and the second circuit board 25 is disposed under the first circuit board 21.

In one embodiment of the invention, elements or circuit located on the first circuit board 21 may be defined as the radio frequency module 23. For example, the radio frequency module 23 may comprise an antenna unit 231, a plurality of ground lines 232, a first frequency tuning element 2331, a second frequency tuning element 2333, a first feed line 2341, a second feed line 2343, a first impedance matching element 2351, a second impedance matching element 2353, a first ground layer 236, a radio frequency circuitry 237 and a first clearance area 238. The radio frequency circuitry 237 may include at least one integrated circuit (IC) or at least one semiconductor chip which is needed for the processing of radio frequency signals. The first clearance area 238 is located on the first circuit board 21, and the antenna unit 231 is disposed in the first clearance area 238 of the first circuit board 21.

The antenna unit 231 of the embodiment may comprise two different resonant frequencies, and the structure of the antenna unit 231 will be described in following embodiment. The antenna unit 231 is electrically connected to a plurality of ground lines 232, the first feed line 2341, the second feed line 2343, the first frequency tuning element 2331 and the second frequency tuning element 2333, wherein the antenna unit 231 is electrically connected to the first frequency tuning element 2331 via one of ground lines 232, and electrically connected to second frequency tuning element 2333 via another ground line 232. The first frequency tuning element 2331 is electrically connected to the antenna unit 231, the first feed line 2341 and at least one ground line 232, and the second frequency tuning element 2333 is electrically connected to the antenna unit 231, the second feed line 2343 and at least one ground line 232.

The first impedance matching element 2351 is electrically connected to the first feed line 2341, and the second impedance matching element 2353 is electrically connected to the second feed line 2343. The radio frequency circuitry 237 is electrically connected to the first feed line 2341 and the second feed line 2343, wherein the radio frequency circuitry 237 is electrically connected to the antenna unit 231 via the first feed line 2341 and the first impedance matching element 2351, and is also electrically connected to the antenna unit 231 via the second feed line 2343 and the second impedance matching element 2353.

The antenna unit 231 is able to transmit and receive signals of two resonant frequencies, i.e., a first resonance frequency and a second resonance frequency, wherein the antenna unit 231 is able to send the signal of the first resonance frequency to the radio frequency circuitry 237 through the first feed line 2341 and the first impedance matching element 2351, and is able to send the signal of the second resonance frequency to radio frequency circuitry 237 through the second feed line 2343 and the second impedance matching unit 2353.

The second circuit board 25 comprises a third frequency tuning element 2511, a fourth frequency tuning element 2513 and a second ground layer 253. The second ground layer 253 is electrically connected to the first ground layer 236 on the first circuit board 21, the third frequency tuning element 2511 is electrically connected to the first frequency tuning element 2331 on the first circuit board 21, and the fourth frequency tuning element 2513 is electrically connected to the second frequency tuning element 2333 on the first circuit board 21. For example, the third frequency tuning element 2511 and the first frequency tuning element 2331 are connected in a parallel manner, and the fourth frequency tuning element 2513 and the second frequency tuning element 2333 are connected in a parallel manner.

The first frequency tuning element 2331, the second frequency tuning element 2333, the third frequency tuning element 2511 and the fourth frequency tuning element 2513 are used to adjust the resonance frequencies the antenna unit 231. The first frequency tuning element 2331, the second frequency tuning element 2333, the third frequency tuning element 2511 and the fourth frequency tuning element 2513 may comprise at least one passive component, such as at least one capacitor, at least one inductor or at least one resistor. More specifically, the first frequency tuning element 2331 and the third frequency tuning element 2511 can be used to adjust the first resonance frequency of the antenna unit 231, as well as the second frequency tuning element 2333 and the fourth frequency tuning element 2513 can be used to adjust the second resonance frequency of the antenna unit 231.

In actual application, when the first circuit board 21 and the radio frequency module 23 are disposed on the second circuit board 25, the dimensions and/or devices of the second circuit board 25 may cause resonance frequency changes of the antenna unit 231 on the radio frequency module 23. The third frequency tuning element 2511 and the fourth frequency tuning element 2513 on the second circuit board 25 can be displaced to adjust or modify the resonance frequency of the antenna unit 231. Accordingly, the resonance frequencies of the antenna unit 231 can be adjusted without displacing or changing the components of the radio frequency module 23 and the first circuit board 21. Especially if the first circuit board 21 or the radio frequency module 23 has been certified by the third party, the element of the first circuit board 21 or the radio frequency module 23 may not be allowed to be displaced. Thus, this invention is able to provide a solution to adjust the resonance frequencies of the antenna unit 231 of the radio frequency module 23.

The first circuit board 21 is disposed on top of the second circuit board 25, wherein the first circuit board 21 may comprise at least one connecting unit 239 to electrically connect the first ground layer 236 to the second ground layer 253, or electrically connect the conducting circuits on the first circuit board 21 to the corresponding conducting circuits on the second circuit board 25. In particular embodiment, the connecting unit 239 may pass through the first circuit board 21 or be disposed along the side of the first circuit board 21 to electrically connect the first ground layer 236 to the second ground layer 253, or electrically connect the conducting circuits on the first circuit board 21 to the corresponding conducting circuits on the second circuit board 25. The above described setups of the connecting unit 239 are embodiments of the invention, and are not limitation of the invention.

Figure 11:
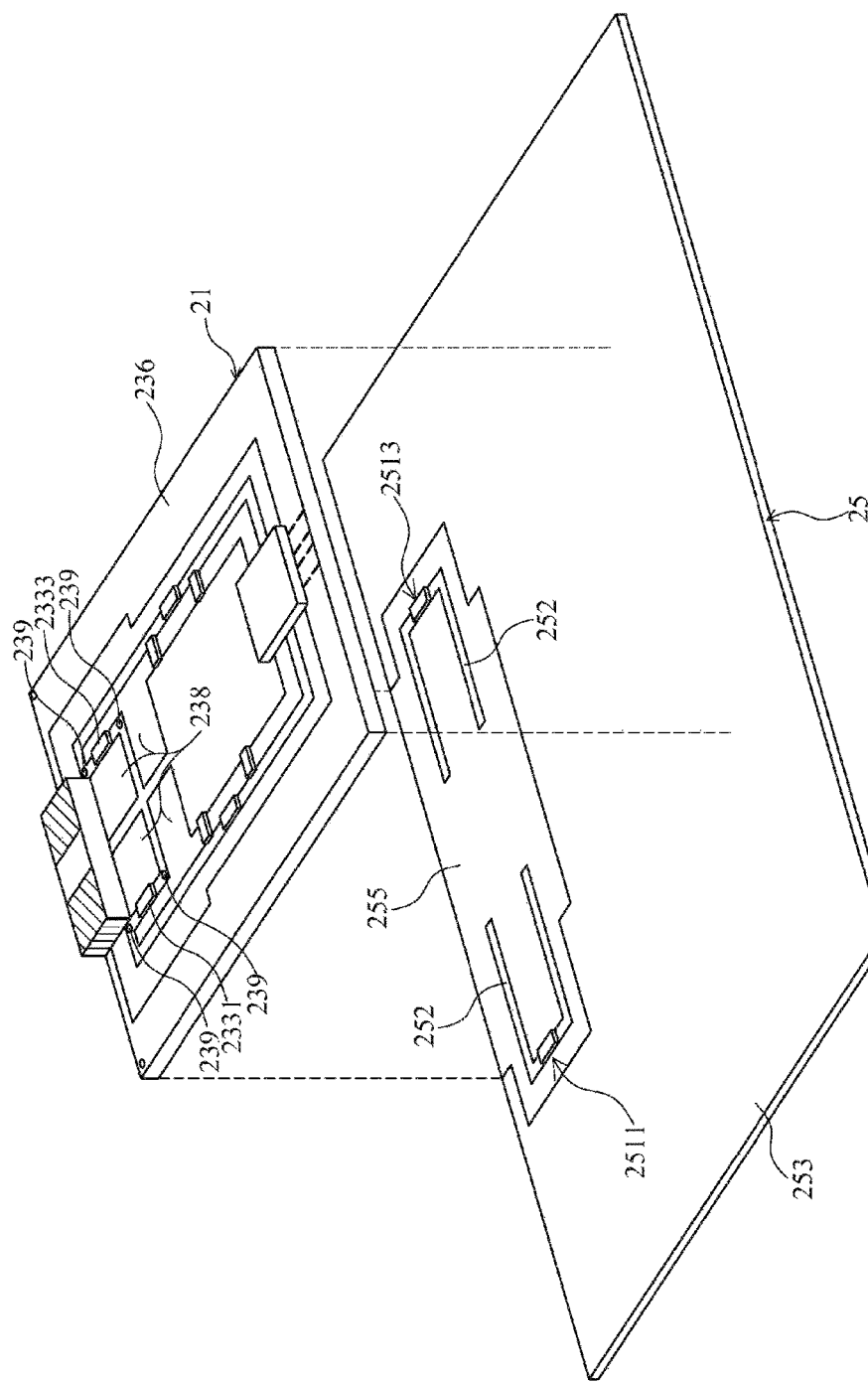
FIG. 11 is a partially exploded perspective view of a radio frequency device with mechanisms for the adjustment of the impedances and frequencies of its antennas according to another embodiment of the invention.

In one embodiment of the invention, as shown in FIG. 11, the second circuit board 25 further comprises a second clearance area 255, wherein the second clearance area 255 is located on the vertically extending region of the first clearance area 238. When the first circuit board 21 is disposed on the second circuit board 25, the first clearance area 238 of the first circuit board 21 will approximately overlap the second clearance area 255 of the second circuit board 25. Further, the third frequency tuning element 2511 and the fourth frequency tuning element 2513 on the second circuit board 25 are connected to one connecting line 252 respectively. Parts of connecting lines 252 are disposed under the first circuit board 21 and/or the first clearance area 238, and thus the first frequency tuning element 2331 and the second frequency tuning element 2333 are connected to the connecting line 252 by the connecting units 239 that pass through the first circuit board 21. For example, the first frequency tuning element 2331 and the third frequency tuning element 2511 are connected in a parallel manner, and the second frequency tuning element 2333 and the fourth frequency tuning element 2513 are connected in a parallel manner.

Figure 12:
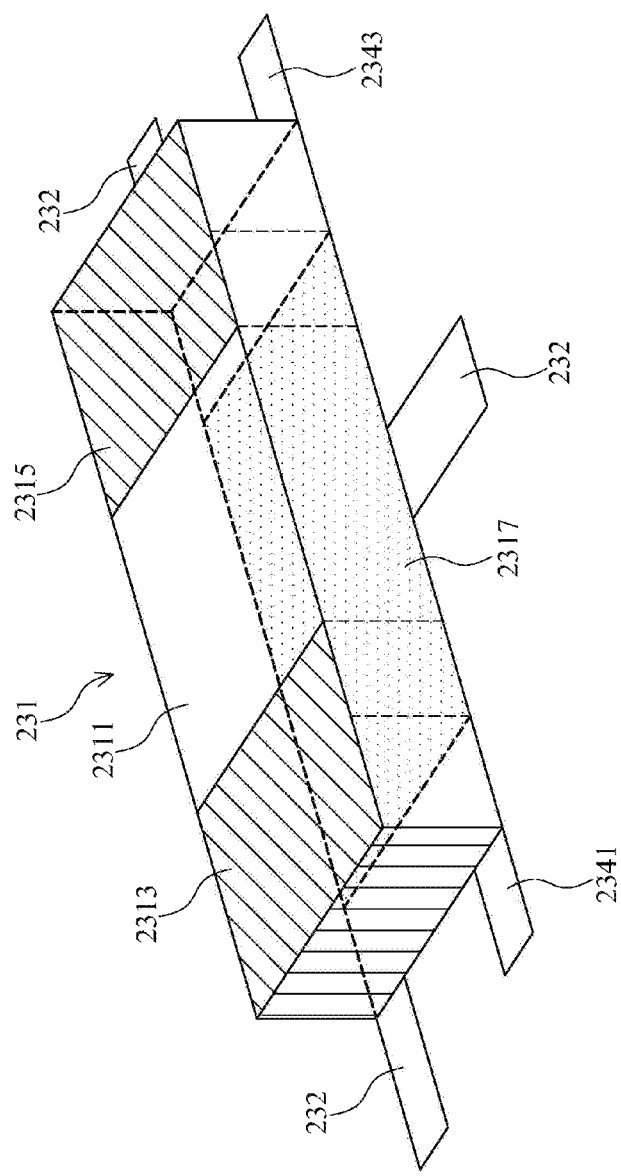
FIG. 12 is a perspective view of an antenna of a radio frequency device according to another embodiment of the invention..

In one embodiment of the invention, the antenna unit 231 comprises at least one substrate 2311 and a plurality of conducting layers 2313/2315/2317, wherein each conducting layer 2313/2315/2317 may be disposed on the surface of the substrate 2311 or within the substrate 2311, as shown in FIG. 12. Further, a plurality of ground lines 232 are connected to each of conducting layers 2313/2315/2317 of the antenna unit 231 respectively, and the first feed line 2341 and the second feed line 2343 are respectively connected to different conducing layers 2313/2315 of the antenna unit 231 for receiving or transmitting signals with different frequencies. Two capacitive effects or two regions which perform like capacitor are respectively formed between the conducting layers 2313/2315/2317 to establish two resonant frequencies of the antenna unit 231.

In one embodiment of the invention, the conducting layers may comprise a first conducting layer 2313, a second conducting layer 2315 and a third conducting layer 2317. The first conducting layer 2313 is disposed on the top surface or the surface of the substrate 2311 or within the substrate 2311 and is electrically connected to the first frequency tuning element 2331 as well as the first impedance matching element 2351 and the radio frequency circuitry 237 via the first feed line 2341. Further, the first conducting layer 2313 may be electrically connected to the first ground layer 236 via the ground line 232.

The second conducting layer 2315 is disposed on the top surface or the surface of the substrate 2311 or within the substrate 2311 and is electrically connected to the second frequency tuning element 2333 as well as the second impedance matching element 2353 and the radio frequency circuitry 237 via the second feed line 2343. Further, the second conducting layer 2315 may be electrically connected to the first ground layer 236 via the ground line 232. In one embodiment of the invention, the first conducting layer 2313 and the second conducting layer 2315 are electrically connected to the first ground layer 236 via at least one ground line 232 respectively.

At least a third conducting layer 2317 is disposed on the bottom surface or the surface of the substrate 2311 or within the substrate 2311. The third conducting layer 2317 and the first conducting layer 2313 or the second conducting layer 2315 can be disposed on different planes, and part of third conducting layer 2317 overlaps part of the first conducting layer 2313 and part of the second conducting layer 2315 to form two regions with capacitive effect or two regions which can perform like capacitors. Further, the third conducting layer 2317 is electrically connected to the first frequency tuning element 2331, the second frequency tuning element 2333 and the first ground layer 236 via at least one ground line 232.

Figure 13:
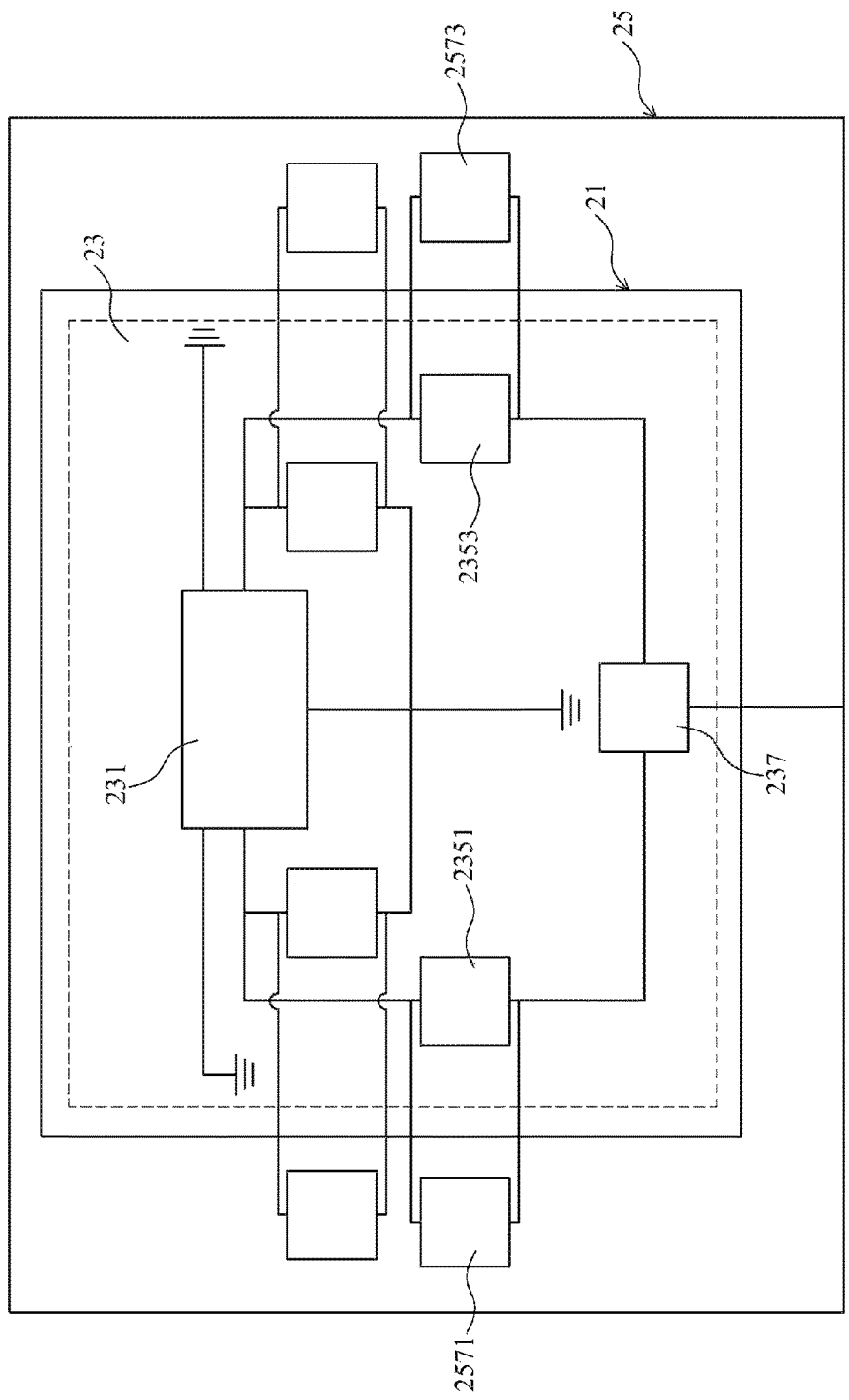
FIG. 13 is a block diagram of a radio frequency device with mechanisms for the adjustment of the impedances and frequencies of its antennas according to another embodiment of the invention.
Figure 14:
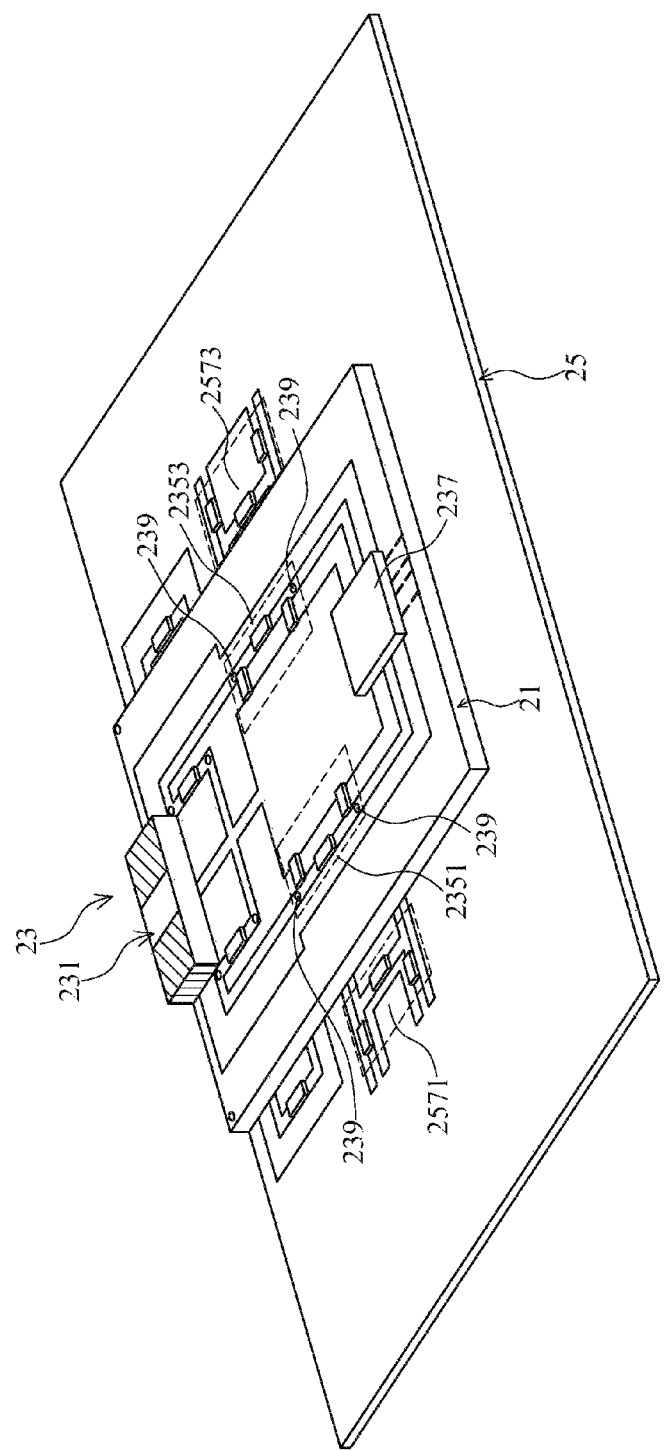
FIG. 14 is a perspective view of a radio frequency device with mechanisms for the adjustment of the impedances and frequencies of its antennas according to another embodiment of the invention.
Figure 15:
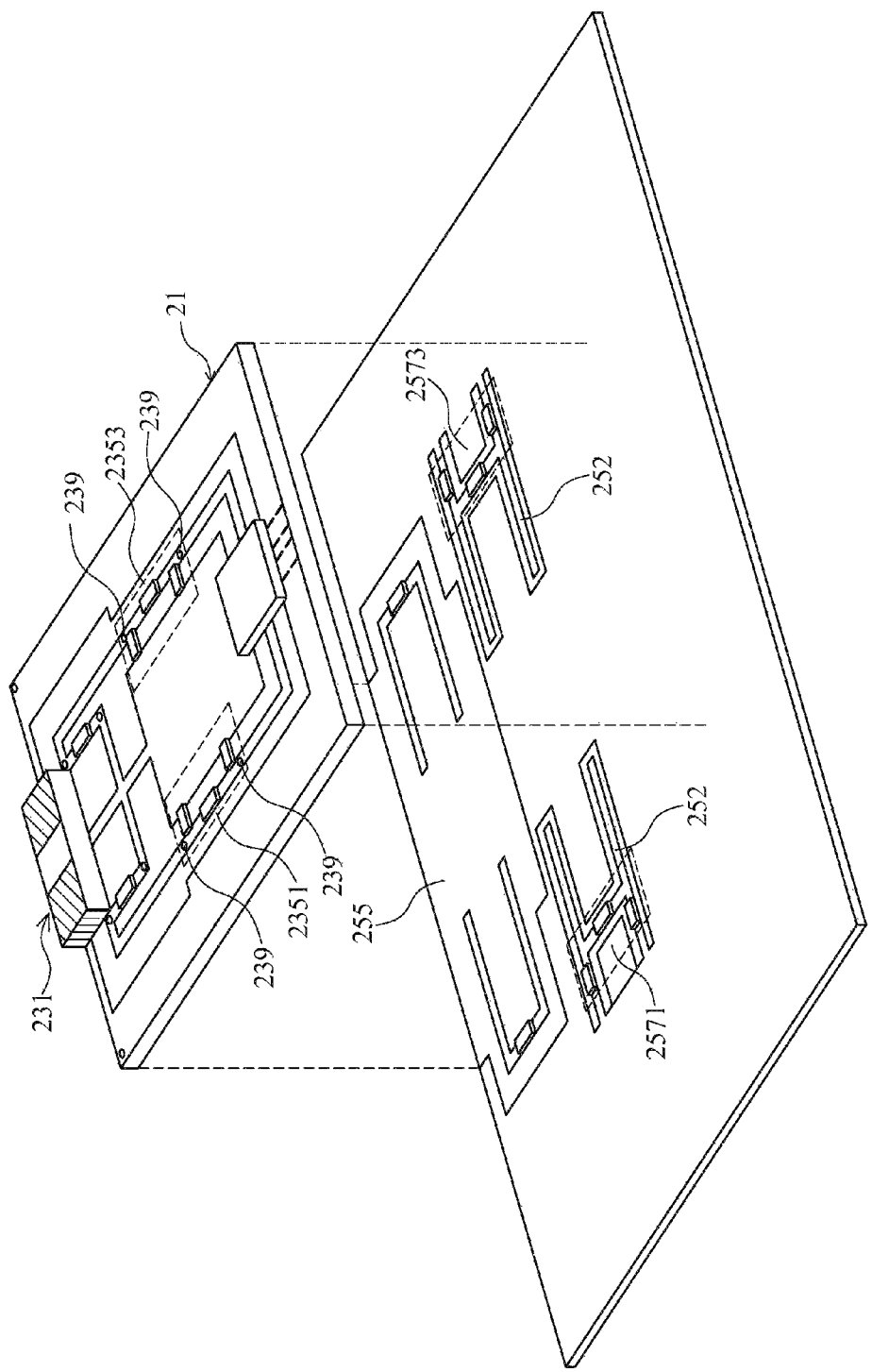
FIG. 15 is a partially exploded perspective view of a radio frequency device with mechanisms for the adjustment of the impedances and frequencies of its antennas according to another embodiment of the invention

In another embodiment of the invention, a third impedance matching element 2571 and/or a fourth impedance matching element 2573 may be disposed on the second circuit board 25, as shown in FIG. 13 to FIG. 15. The third impedance matching element 2571 on the second circuit board 25 is electrically connected to the first impedance matching element 2351 on the first circuit board 21, and the fourth impedance matching element 2573 on the second circuit board 25 is electrically connected to the second impedance matching element 2353 on the first circuit board 21. For example, the third impedance matching element 2571 and the fourth impedance matching element 2573 on the second circuit board 25 are electrically connected to connecting lines 252 respectively. Parts of connecting lines 252 are disposed under the first circuit board 21, and thus the first impedance matching element 2351 and the second impedance matching element 2353 are connected to the connecting lines 252 by the connecting units 239 that pass through the first circuit board 21.

The first impedance matching element 2351, the second impedance matching element 2353, the third impedance matching element 2571 and/or the fourth impedance matching element 2573 are used to adjust impedance matching between the antenna unit 231 on the radio frequency module 23 and the radio frequency circuitry 237. Thus, when the first circuit board 21 and the radio frequency module 23 are disposed on the second circuit board 25, the impedance matching between the antenna unit 231 and the radio frequency circuitry 237 can be achieved.

In one embodiment of the invention, the first impedance matching element 2351, the second impedance matching element 2353, the third impedance matching element 2571 and the fourth impedance matching element 2573 may include at least a resistor, a capacitor, an inductor or a it matching circuit.

In actual application, when the first circuit board 21 and the radio frequency module 23 are disposed on the second circuit board 25, the resonance frequency of the antenna unit 231 of the radio frequency module 23 may be shifted, or the impedance matching between the antenna unit 231 and the radio frequency circuitry 237 may not be achieved due to the variation of the dimensions of the second circuit board or the electric components or metal parts existed on the second circuit board 25. However, if the first circuit board 21 or the radio frequency module 23 has been certified by third party, the element of the first circuit board 21 or the radio frequency module 23 may not be allowed to be displaced. Thus, this invention is able to provide a solution to adjust resonance frequency of the antenna unit 231 of the radio frequency module 23 and achieve impedance matching between the antenna unit 231 and the radio frequency circuitry 237.

As above description of the invention, the third frequency tuning element 2511, the fourth frequency tuning element 2513, the third impedance matching element 2571 and/or the fourth impedance matching element 2573 can be disposed on the second circuit board 25. The third frequency tuning element 2511 and/or the third impedance matching element 2571 are electrically connected to the first frequency tuning element 2331 and/or the first impedance matching element 2351 of the first circuit board 21 respectively, and the fourth frequency tuning element 2513 and/or the fourth impedance matching element 2573 are electrically connected to the second frequency tuning element 2333 and/or the second impedance matching element 2353 of the first circuit board 21 respectively. After disposing the radio frequency module 23 and the first circuit board 21 on the second circuit board 25, the third frequency tuning element 2511 and/or the third impedance matching element 2571 may be displaced to adjust one of resonance frequencies of the antenna unit 231 as well as the impedance matching between the radio frequency circuitry 237 and the antenna unit 231. Further, the fourth frequency tuning element 2513 and/or the fourth impedance matching element 2573 may be displaced to adjust the other resonance frequency of the antenna unit 231 as well as the impedance matching between the radio frequency circuitry 237 and the antenna unit 231.

Figure 16:
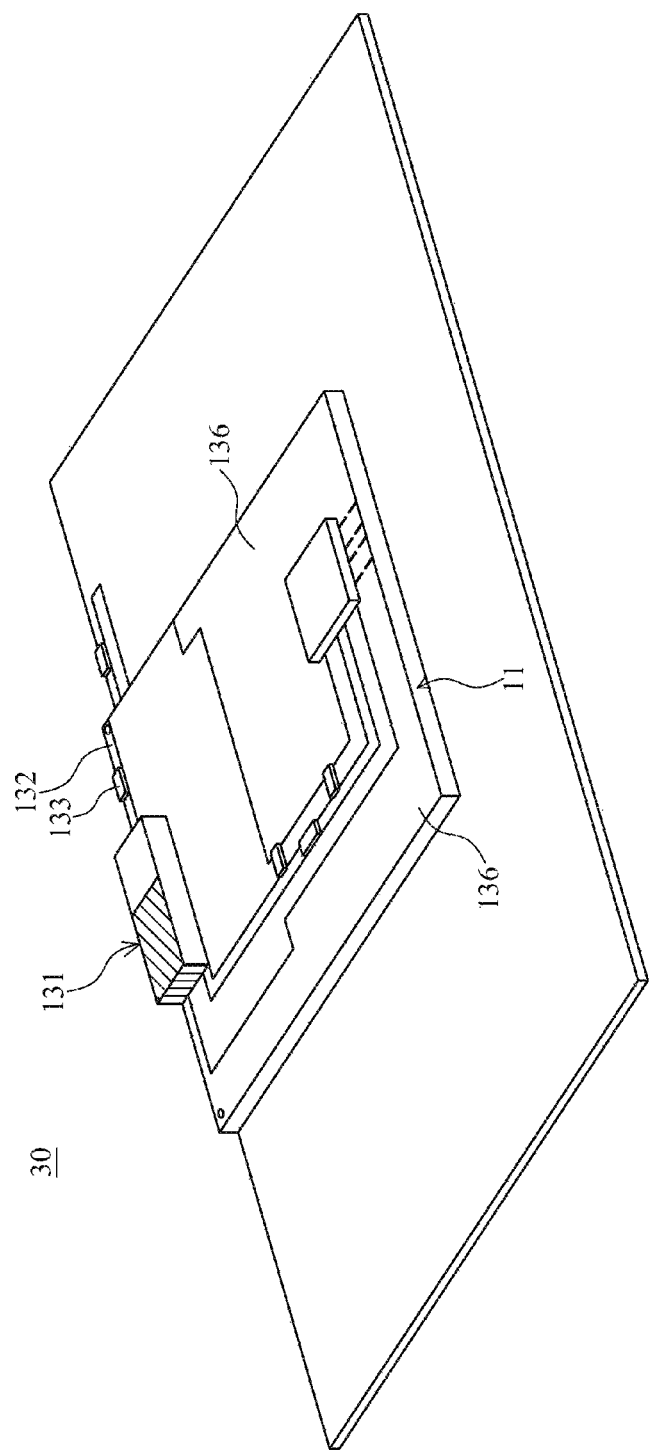
FIG. 16 is a perspective view of a radio frequency device with mechanisms for the adjustment of the impedances and frequencies of its antennas according to another embodiment of the invention.

FIG. 16 is a perspective view of a radio frequency device with mechanisms for adjustment of the impedances and frequencies of its antennas according to another embodiment of the invention. The radio frequency device 30 of the embodiment is similar to the radio frequency device 10 of FIG. 2, and the difference between the radio frequency devices 10 and 30 is that the ground line 132 which is connected to the first frequency tuning element 133 of the radio frequency device 30 does not be connected to the first ground layer 136 of the first circuit board 11. On the contrary, the ground line 132 of the antenna unit 131 in FIG. 2 that is connected with the first frequency tuning element 133 is connected to the first ground layer 136 of the first circuit board 11.

Figure 17:
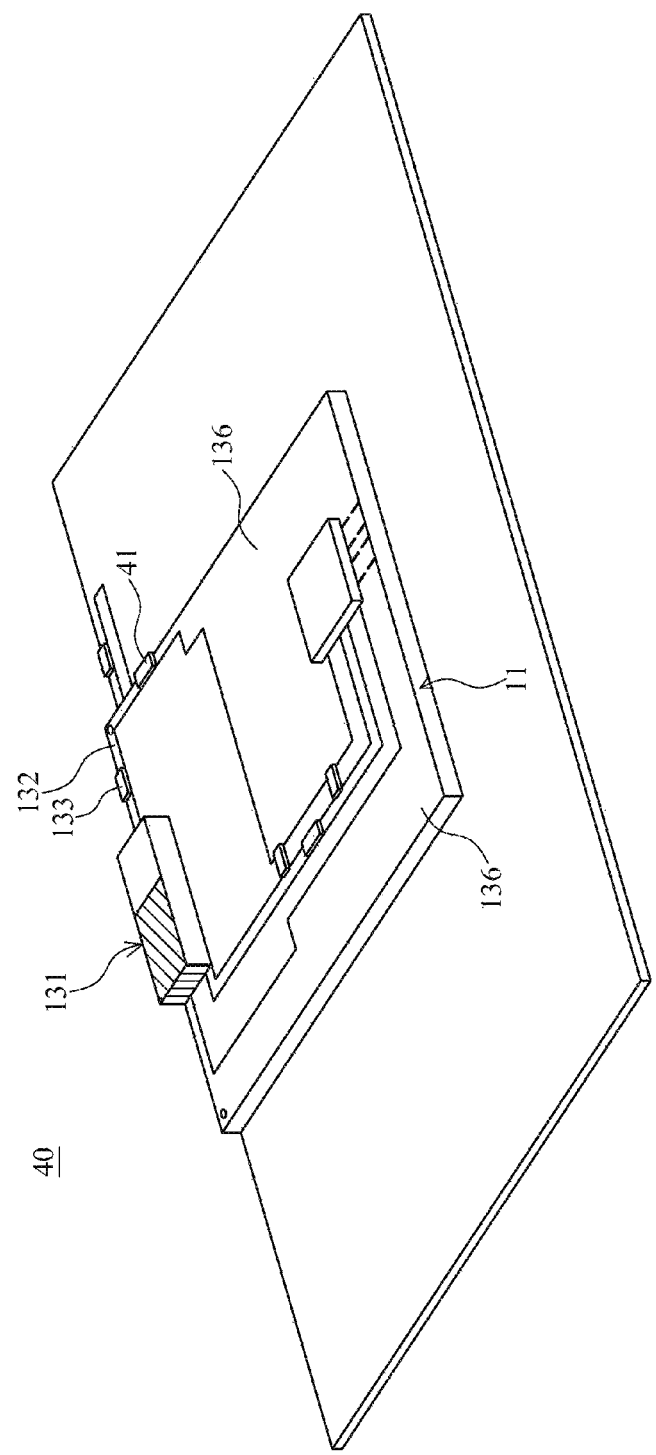
FIG. 17 is a perspective view of a radio frequency device with mechanisms for the adjustment of the impedances and frequencies of its antennas according to another embodiment of the invention.

FIG. 17 is a perspective view of a radio frequency device with mechanisms for adjustment of the impedances and frequencies of its antennas according to another embodiment of the invention. The radio frequency device 40 of the embodiment is similar to the radio frequency device 10 of FIG. 2, and the difference between the radio frequency devices 10 and 40 is that the ground line 132 which is connected to the first frequency tuning element 133 of the radio frequency device 40 is connected to the first ground layer 136 of the first circuit board 11 via a resistor 41. On the contrary, the ground line 132 of the antenna unit 131 in FIG. 2 that is connected with the first frequency tuning element 132 is connected to the first ground layer 136 on the first circuit board 11 directly.

Figure 18:
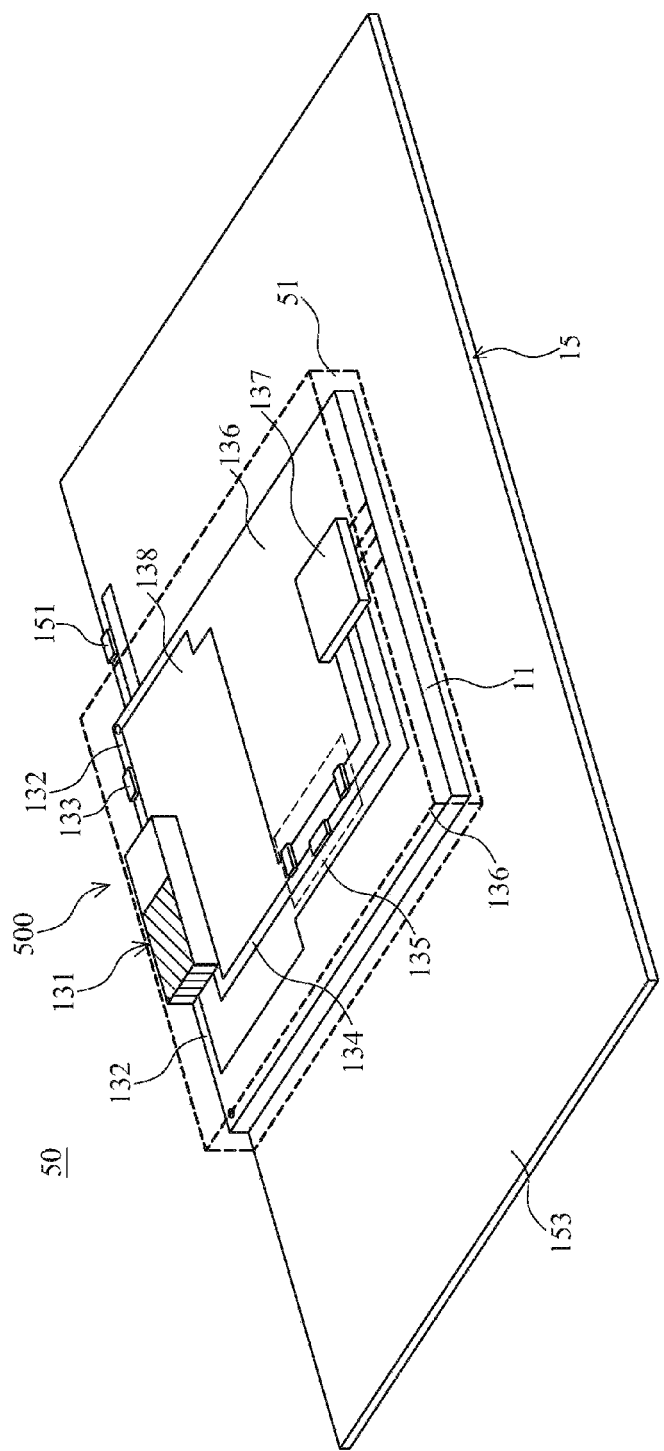
FIG. 18 is a perspective view of a radio frequency device with mechanisms for the adjustment of the impedances and frequencies of its antennas according to another embodiment of the invention.

FIG. 18 and FIG. 19 are respectively a perspective view and a partially exploded perspective view of a radio frequency device with mechanisms for adjustment of the impedances and frequencies of its antennas according to another embodiment of the invention. The difference between the radio frequency device 50 in FIG. 18 and the radio frequency device 10 in FIG. 2 is that the radio frequency device 50 further comprises a package configuration or structure 51. The package configuration or structure 51 of the radio frequency device 50 is able to enclose the first circuit board 11, the antenna unit 131, the first frequency tuning unit 133, the first impedance matching unit 135, the first clearance area 138, the ground line 132, the radio frequency circuitry 137, the feed line 134 and the first ground layer 136 to form a packaged radio frequency module 500. The packaged radio frequency module 500 also comprises multiple connecting pads, pins, bumps or balls to establish all the connections needed for signal transmission or electric connection between the first circuit board 11 and the second circuit board 15.

Further, the package configuration or structure 51 described in this embodiment of the invention is able to be used in radio frequency devices 100/20/30/40 of other embodiments, and thus the package configuration or structure 51 is able to enclose the first circuit boards 11/21 and elements or circuitry on the first circuit boards 11/21 to form the packaged radio frequency module and to establish all the connections needed for signal transmission or electric connection between the first circuit board 11/21 and the second circuit boards 15/25.

The above disclosure is only the preferred embodiment of the present invention, and not used for limiting the scope of the present invention. All equivalent variations and modifications on the basis of shapes, structures, features and spirits described in claims of the present invention should be included in the claims of the present invention.

The invention claimed is:

1. A radio frequency device with mechanisms for the adjustment of impedances and frequencies of its antennas comprising:
   a first circuit board;
   at least one radio frequency module disposed on said first circuit board, and comprising an antenna unit, a first frequency tuning element, a first impedance matching element, a first clearance area, a plurality of ground lines, a radio frequency circuitry, a feed line and a first ground layer, wherein said first clearance area is located on said first circuit board;
   said antenna unit is located within said first clearance area of said first circuit board and is electrically connected to at least one of said ground lines, said feed line and said first frequency tuning element; said first frequency tuning element is electrically connected to said antenna unit and at least one of said ground lines; and said first impedance matching element is electrically connected to said feed line and is also electrically connected to said radio frequency circuitry and said antenna unit via said feed line; and
   a second circuit board disposed under said first circuit board, and comprising a second ground layer, a second frequency tuning element, wherein said second ground layer is electrically connected to said first ground layer; and said second frequency tuning element is electrically connected to said second ground layer, and is also electrically connected to said first frequency tuning element via at least one of said ground lines on said first circuit board.

2. The radio frequency device of claim 1, wherein said ground line that is electrically connected to said first frequency tuning element does not be connected to said first ground layer of said first circuit board.

3. The radio frequency device of claim 1, wherein said ground line that is electrically connected to said first frequency tuning element is electrically connected to said first ground layer of said first circuit board via a resistor.

4. The radio frequency device of claim 1, wherein said radio frequency circuitry includes at least one integrated circuit or at least one semiconductor chip.

5. The radio frequency device of claim 1, further comprising a second impedance matching element located on said second circuit board, and said second impedance matching element electrically connected to said first impedance matching element on said first circuit board.

6. The radio frequency device of claim 1, wherein said second circuit board further comprises a second clearance area located on a vertically extending region of said first clearance area.

7. The radio frequency device of claim 1, wherein said antenna unit comprises:
   at least one substrate;
   a plurality of conducting layers disposed on a surface of said substrate or within said substrate, wherein at least one of said ground lines is connected to at least one of said conducting layers of said antenna unit, and said feed line is connected to another said conducting layer, wherein said conducting layers form a capacitive effect or a region performing like capacitor between them so as to establish a resonance frequency of said antenna unit.

8. The radio frequency device of claim 1, wherein said antenna unit comprises:
   at least one substrate;
   at least one first conducting layer disposed on a surface of said substrate or within said substrate, wherein said first conducting layer is electrically connected to said first frequency tuning element; and
   at least one second conducting layer disposed on said surface of said substrate or within said substrate, wherein said second conducting layer is electrically connected to said feed line and at least one of said ground lines, wherein said first conducting layer and said second conducting layer form a capacitive effect or a region performing like capacitor between them so as to establish a resonance frequency of said antenna unit.

9. The radio frequency device of claim 8, wherein said first conducting layer and said second conducting layer are disposed on different planes, and part of said first conducting layer and part of said second conducting layer overlap to form said capacitive effect or said region performing like capacitor so as to establish said resonance frequency of said antenna unit.

10. The radio frequency device of claim 8, wherein said first conducting layer and said second conducting layer are disposed on the same plane or substantially same plane, and a gap is located between said first conducting layer and said second conducting layer to form said capacitive effect or said region performing like capacitor between them so as to establish said resonance frequency of said antenna unit.

11. The radio frequency device of claim 1, wherein said first frequency tuning element and said second frequency tuning element comprise at least one capacitor or at least one inductor or at least one resistor.

12. The radio frequency device of claim 1, wherein said ground line that does not be connected to said first frequency tuning element also does not be connected to said first ground layer of said first circuit board but is electrically connected to said second ground layer of said second circuit board via a second impedance matching element.

13. The radio frequency device of claim 12, wherein said ground line that is connected to said first frequency tuning element does not be connected to said first ground layer of said first circuit board.

14. The radio frequency device of claim 1, further comprising a package configuration or structure enclosing said first circuit board, said antenna unit, said first frequency tuning unit, said first impedance matching unit, said first clearance area, said ground line, said radio frequency circuitry, said feed line and said first ground layer to form a packaged radio frequency module.

15. A radio frequency device with mechanisms for the adjustment of impedances and frequencies of its antennas comprising:
a first circuit board;
at least one radio frequency module disposed on said first circuit board, and comprising an antenna unit, a first frequency tuning element, a second frequency tuning element, a first impedance matching element, a second impedance matching element, a first clearance area, a plurality of ground lines, a radio frequency circuitry, a first feed line, a second feed line and a first ground layer, wherein said first clearance area is located on said first circuit board; said antenna unit having two resonance frequencies is located within said first clearance area of said first circuit board, and is electrically connected to said ground lines, said first feed line, said second feed line, said first frequency tuning element and said second frequency tuning element; said first frequency tuning element is electrically connected to said antenna unit, said first feed line and at least one of said ground lines; said second frequency tuning element is electrically connected to said antenna unit, said second feed line and at least one of said ground lines; said first impedance matching element is electrically connected to said first feed line, and is electrically connected to said radio frequency circuitry and said antenna unit via said first feed line; and said second impedance matching element is electrically connected to said second feed line, and is electrically connected to said radio frequency circuitry and said antenna unit via said second feed line; and
a second circuit board disposed under said first circuit board, and comprising a second ground layer, a third frequency tuning element and a fourth frequency tuning element, wherein said second ground layer is electrically connected to said first ground layer; said third frequency tuning element is electrically connected to said first frequency tuning element on said first circuit board; and said fourth frequency tuning element is electrically connected to said second frequency tuning element on said first circuit board.

16. The radio frequency device of claim 15, wherein said radio frequency circuitry includes at least one integrated circuit or at least one semiconductor chip.

17. The radio frequency device of claim 15, wherein said third frequency tuning element and said first frequency tuning element are connected in a parallel manner, said fourth frequency tuning element and said second frequency tuning element are connected in a parallel manner.

18. The radio frequency device of claim 15, further comprising a third impedance matching element located on said second circuit board, and electrically connected to said first impedance matching element.

19. The radio frequency device of claim 15, further comprising a fourth impedance matching element located on said second circuit board, and electrically connected to said second impedance matching element.

20. The radio frequency device of claim 15, wherein said second circuit board further comprises a second clearance area located on a vertically extending region of said first clearance area.

21. The radio frequency device of claim 15, wherein said antenna unit comprises:
at least one substrate;
a plurality of conducting layers disposed on a surface of said substrate or within said substrate, wherein said ground lines are connected to said conducting layers of said antenna unit respectively, and said first feed line and said second feed line are connected to different conducting layers respectively to transmit or receive signals with different frequencies, wherein said conducting layers respectively form two regions having capacitive effect or performing like capacitors between them to establish said two resonance frequencies of said antenna unit.

22. The radio frequency device of claim 15, wherein said antenna unit comprises:
at least one substrate;
at least one first conducting layer disposed on a surface of said substrate or within said substrate, wherein said first conducting layer is electrically connected to said first frequency tuning element, and then is electrically connected to said first ground layer via said first frequency tuning element; and said first conducting layer is electrically connected to said first impedance matching element via said first feed line, and then is connected to said radio frequency circuitry via said first impedance matching element;
at least one second conducting layer disposed on said surface of said substrate or within said substrate, wherein said second conducting layer is electrically connected to said second frequency tuning element, and then is connected to said first ground layer via said second frequency tuning element; and said second conducting layer is electrically connected to said second impedance matching element via said second feed line, and then is connected to said radio frequency circuitry via said second impedance matching element; and
at least one third conducting layer disposed on said surface of said substrate or within said substrate, wherein said third conducting layer and said first conducting layer or said second conducting layer are disposed on different planes, wherein said third conducting layer is electrically connected to said first frequency tuning element, said second frequency tuning element and said first ground layer via at least one of said ground lines, and parts of said third conducting layer overlaps part of said first conducting layer and part of said second conducting layer respectively to form two regions having capacitive effect or performing like capacitors between said conducting layers so as to establish two resonance frequencies of said antenna unit.

23. The radio frequency device of claim 22, wherein said first conducting layer and said second conducting layer are respectively connected to said first ground layer via said ground lines.

24. The radio frequency device of claim 15, wherein said first frequency tuning element, said second frequency tuning element, said third frequency tuning element and said fourth frequency tuning element comprise at least one capacitor or at least one inductor or at least one resistor.

25. The radio frequency device of claim 15, further comprising a package configuration or structure enclosing said first circuit board, said antenna unit, said first frequency tuning unit, said first impedance matching unit, said first clearance area, said ground line, said radio frequency circuitry, said feed line and said first ground layer to form a packaged radio frequency module.

* * * * *